(12) United States Patent
Buller et al.

(10) Patent No.: US 8,443,558 B2
(45) Date of Patent: May 21, 2013

(54) SUPPORT SYSTEM FOR SOLAR ENERGY GENERATOR PANELS

(75) Inventors: Benyamin Buller, Sylvania, OH (US); Chris Gronet, Portola Valley, CA (US); Kelly Truman, San Jose, CA (US); Thomas Brezoczky, Los Gatos, CA (US)

(73) Assignee: Solyndra LLC, Fremont, CA (US)

( * ) Notice: Subject to any disclaimer, the term of this patent is extended or adjusted under 35 U.S.C. 154(b) by 123 days.

(21) Appl. No.: 12/288,107

(22) Filed: Oct. 15, 2008

(65) Prior Publication Data

US 2009/0095280 A1 Apr. 16, 2009

Related U.S. Application Data

(60) Provisional application No. 60/999,146, filed on Oct. 15, 2007.

(51) Int. Cl.
*E04D 13/18* (2006.01)

(52) U.S. Cl.
USPC ............................. 52/173.3; 52/263; 52/460

(58) Field of Classification Search
USPC ............ 52/173.3, 220.1, 220.3, 220.5, 220.7, 52/263, 460, DIG. 11; 211/13.1; 108/26, 108/152; 248/237
See application file for complete search history.

(56) References Cited

U.S. PATENT DOCUMENTS

| | | | |
|---|---|---|---|
| 3,921,575 A | 11/1975 | Ishii et al. | |
| 4,114,330 A * | 9/1978 | Sukolics | ................. 52/200 |
| 4,223,667 A | 9/1980 | Paymal | |
| 4,225,638 A | 9/1980 | Waugh | |
| 4,451,507 A | 5/1984 | Beltz et al. | |
| 4,620,985 A | 11/1986 | Goodburn et al. | |
| 4,851,095 A | 7/1989 | Scobey et al. | |
| 5,055,036 A | 10/1991 | Asano et al. | ................. 432/5 |
| 5,215,420 A | 6/1993 | Hughes et al. | |
| 5,356,261 A | 10/1994 | Nishi | ................. 414/744.7 |
| 5,373,839 A | 12/1994 | Hoang | |
| 5,509,237 A * | 4/1996 | Coulter | ................. 52/126.6 |
| 5,588,996 A | 12/1996 | Costello | |
| 5,611,861 A | 3/1997 | Higashi | ................. 118/719 |
| 5,705,321 A | 1/1998 | Brueck et al. | ................. 430/316 |
| 6,018,383 A | 1/2000 | Dunn et al. | |
| 6,079,693 A | 6/2000 | Ettinger et al. | ................. 251/195 |
| 6,431,320 B1 | 8/2002 | Nichols | ................. 187/263 |
| 6,435,868 B2 | 8/2002 | White et al. | ................. 432/247 |
| 6,460,369 B2 | 10/2002 | Hosokawa | ................. 62/378 |
| 6,499,426 B1 | 12/2002 | Windischmann et al. | ..... 118/723 |
| 6,662,673 B1 | 12/2003 | Olgado | ................. 74/490.01 |
| 6,681,716 B2 | 1/2004 | Schaepkens | ................. 118/723 |
| 7,313,893 B2 * | 1/2008 | Voegele, Jr. | ................. 52/461 |
| 7,441,379 B2 * | 10/2008 | Konstantin | ................. 52/200 |
| 7,600,349 B2 * | 10/2009 | Liebendorfer | ................. 52/173.3 |
| 7,661,234 B2 * | 2/2010 | Voegele, Jr. | ................. 52/466 |
| 2001/0001407 A1 | 5/2001 | You et al. | ................. 156/166 |

(Continued)

*Primary Examiner* — William Gilbert
*Assistant Examiner* — Patrick Maestri
(74) *Attorney, Agent, or Firm* — Morgan, Lewis & Bockius LLP

(57) ABSTRACT

A support system for a solar panel comprises a plurality of legs configured to receive multiple solar panels. The legs each comprise a base, a plurality of shafts, and a support precipice. The support precipice is divided into two sides by a t-bar. The first side comprises a guiding wing to effectuate modular assembly of the support system. The second side comprises a beveled edge to effectuate secure coupling of a solar panel. The system is able to be assembled and disassembled without the use of tools or implements. The system is also movable.

4 Claims, 6 Drawing Sheets

U.S. PATENT DOCUMENTS

| | | |
|---|---|---|
| 2001/0015074 A1 | 8/2001 | Hosokawa |
| 2002/0083739 A1 | 7/2002 | Pandelisev |
| 2003/0154923 A1 | 8/2003 | Cheung |
| 2004/0231759 A1 | 11/2004 | Kobayashi et al. ........... 148/562 |
| 2006/0037700 A1 | 2/2006 | Shi et al. |
| 2006/0201074 A1 | 9/2006 | Kurita et al. .................. 52/79.1 |

* cited by examiner

SUPPORT SYSTEM FOR SOLAR ENERGY GENERATOR PANELS

CROSS REFERENCE TO RELATED APPLICATION

This application claims priority to U.S. Provisional Application No. 60/999,146, filed Oct. 15, 2007.

FIELD OF THE INVENTION

The present invention is related to mounting apparatus for solar panels. More specifically, the present invention is related to modular support systems for solar panels.

BACKGROUND OF THE INVENTION

Current trends in energy production point towards a need for both renewable resources and "green" resources. As the actual, environmental and political costs of fossil fuels continue to rise and accelerate, consumers demand alternate energy sources that are quickly deployable and easily plug and play into existing energy providing networks. To that end, solar power has become a prevalent source for both residential and commercial buildings. FIG. 1 shows a typical solar power system 100 in current practice. Generally, solar cells 110 are angled south when utilized in the Northern hemisphere. The specific angle is usually determined as a function of latitude, to maximize incident sunlight 120 with the solar cell 110. However, several drawbacks to solar power have prevented widespread deployment of such systems 100. The first is that due to the angle required, the frames 115 that support the solar cells 110 must be securely anchored to the building 140 on which the cells 110 are installed because the angle causes the cells 110 to act as sails in any force of wind. In order to securely anchor the frames 115 to the building 140, holes must be drilled through the roof of the building 140. Such drilling can require adherence to building codes, hiring of contractors to do the work, and other expenses on top of the cost of the solar power system 100 itself.

In typical tilted solar power systems 100 as shown, the angle of the solar cells 110 forms a "dead zone" where shadows fall as the sun traverses the sky. Panels placed within those "dead zones" will suffer decreased current production during the times in which shadows fall upon them. Generally, no panels are placed within "dead zones," detrimentally effect overall current generation and efficient and compact use of available space on roof tops.

Furthermore, rooftops of most commercial buildings, and some residential buildings, have pipes 130 thereupon for air ventilation, climate control, and the like. Such pipes 130 routinely require service, and due to that requirement, the frames 115 cannot cost effectively be built around or over the pipes 130. If the frames 115 are installed over the pipes 130, service to the pipes would require the removal of the anchor bolts to remove the frames 115, increasing the cost of service. Frequently, the frames 115 are not able to be installed over pipes 130. If a pipe 130 were to burst, the frames 115 installed around and above the pipe 130 would delay emergency repairs. In some municipalities, building codes restrict permanent fixtures such as solar panes from being installed above piping. Because of these drawbacks, large areas on roofs cannot be used for solar power generation. Also, up to half the cost of deploying a solar power system 100 is non recoverable installation cost. Many other support systems for solar panels are currently used other than the frame 120 shown, but all suffer from the inherent deficiencies mentioned above.

DETAILED DESCRIPTION OF THE INVENTION

Methods and apparatuses directed to supports and systems for supporting solar panels are described herein. In general, supports and support systems for flat lying solar panels are envisioned. In this specification and claims, the term "support" can refer to an object for holding a solar panel above a surface. Furthermore, "solar panel" can refer to a planar solar cell, collection of solar cells, a frame holding at least one planar or non-planar solar cell, or the like. Other embodiments of the present invention will readily suggest themselves to people skilled in the relevant arts. Other embodiments, although time consuming to discover, would nonetheless be a routine engineering effort to such skilled people having the benefit of this disclosure.

Reference will now be made in detail to implementations of the present invention as illustrated in the accompanying drawings. The drawings may not be to scale. The same reference indicators will be used throughout the drawings and the following detailed description to refer to identical or like elements. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application, safety regulations and business related constraints, and that these specific goals will vary from one implementation to another and from one developer to another. Moreover, it will be appreciated that such a development effort will be a routine undertaking of engineering for those of ordinary skill in the art having the benefit of this disclosure.

Figure 2A:
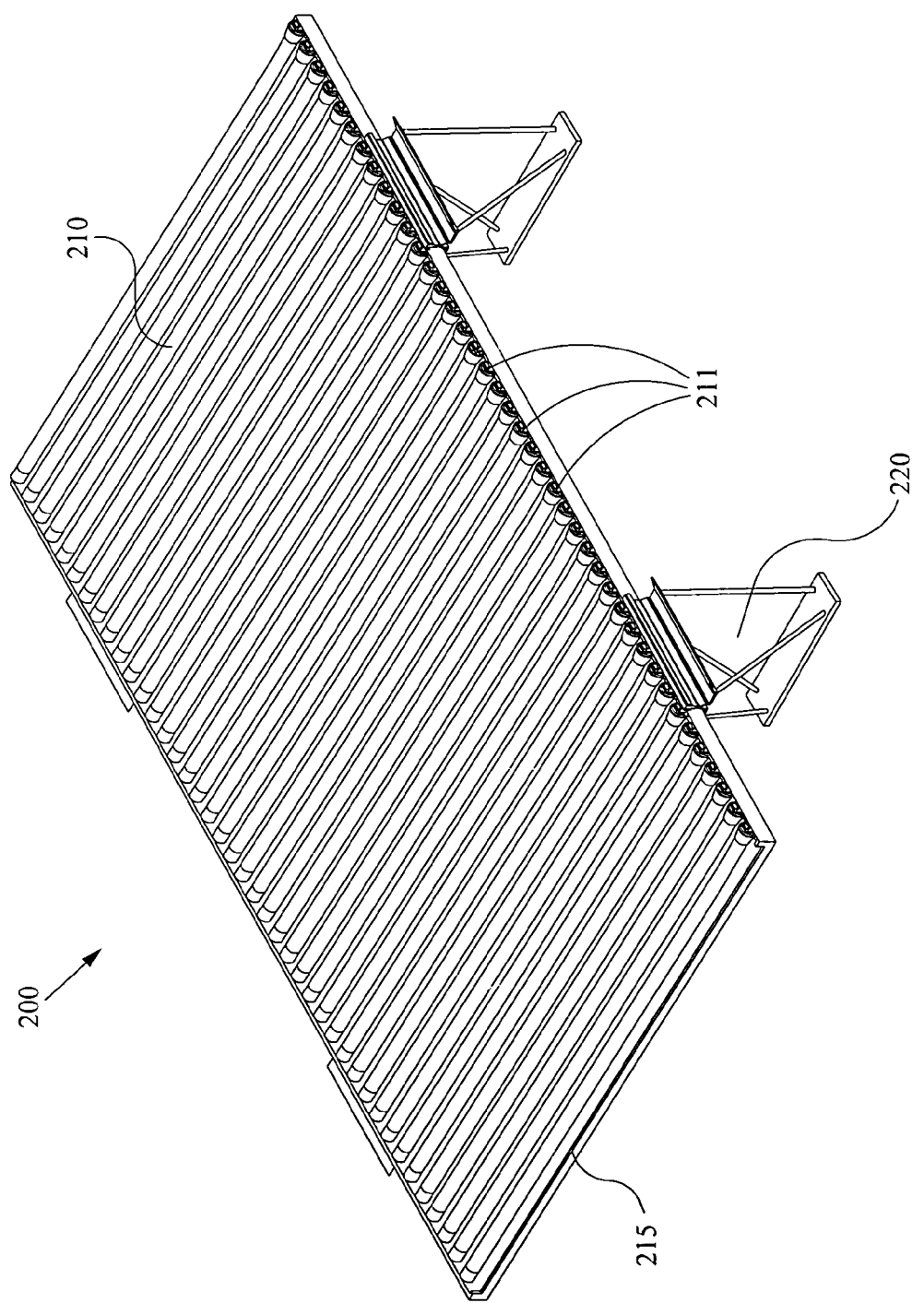
FIG. 2A shows a support system for a flat lying solar power system.

FIG. 2A shows a support system 200 comprising a solar panel 210 and a plurality of support legs 220. In this particular exemplary embodiment, the solar panel 210 comprises a plurality of non-planar, cylindrical solar cells 211 coupled to a frame 215. The cells 211 are able to be permanently coupled or demountably coupled to the frame 215. As shown, the support system 200 is not bolted, welded, or otherwise permanently or semi-permanently coupled to the frame 215. The support system 200 holds the panel 210 substantially parallel to the surface on which the system 200 is placed, such as a rooftop. Thus, gusts of wind will not exert force necessary to move the system 200. Also, gaps between the solar cells 211 allow for wind to blow through thereby helping to reduce wind resistence. Further, the gaps between the cells greatly reduce lift forces generated between the bottom and top surfaces of the solar panel. As a result, the system 200 does not need to be anchored to the surface on which it is placed.

Instead, the system 200 is modular, and able to be assembled, disassembled, and moved with ease. However, the system may be permanently or semi permanently affixed to a structure if so desired using any common or convenient method such as welding or bolting.

Figure 2B:
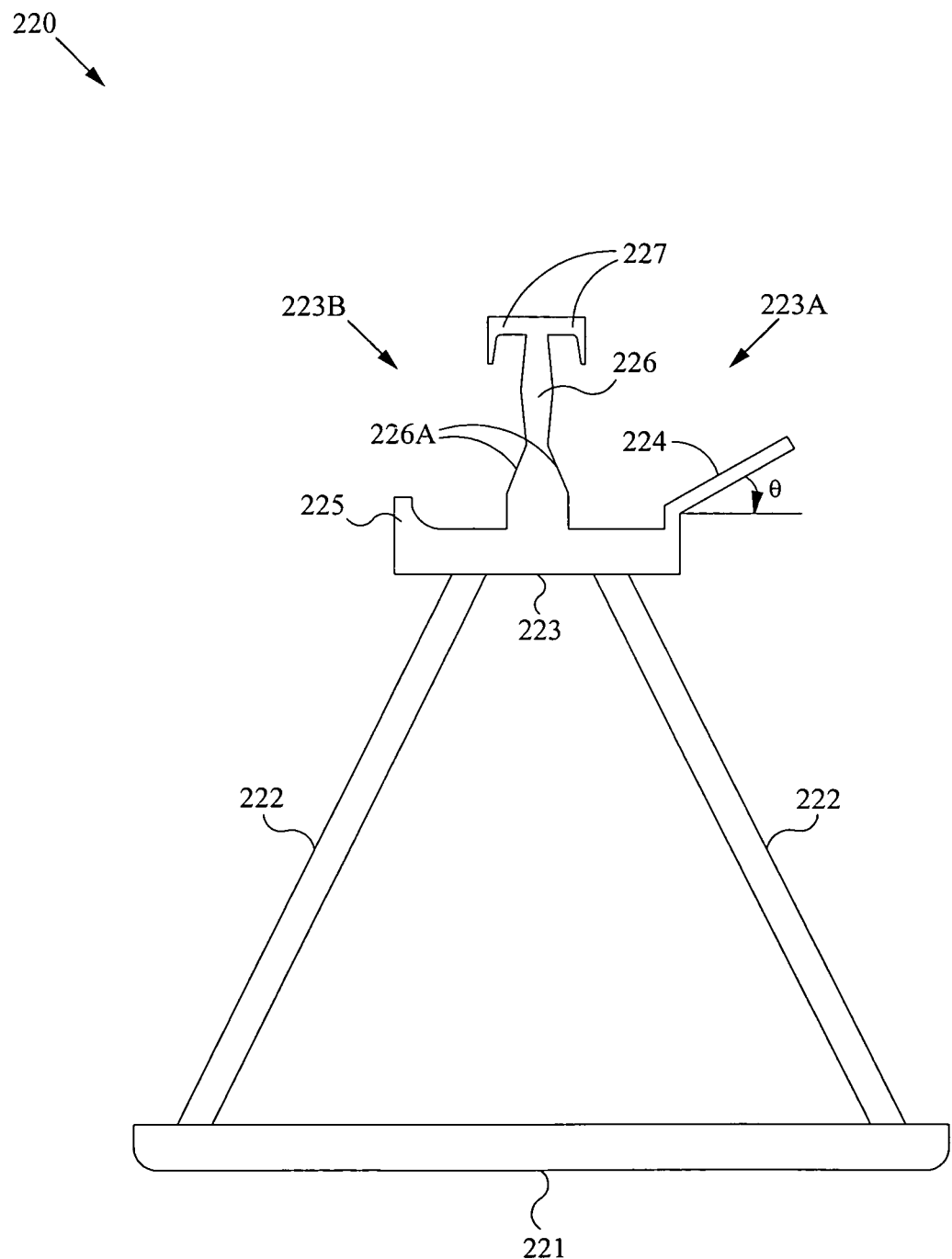
FIG. 2B shows a cross section of a support leg for a flat lying solar power system.
Figure 2C:
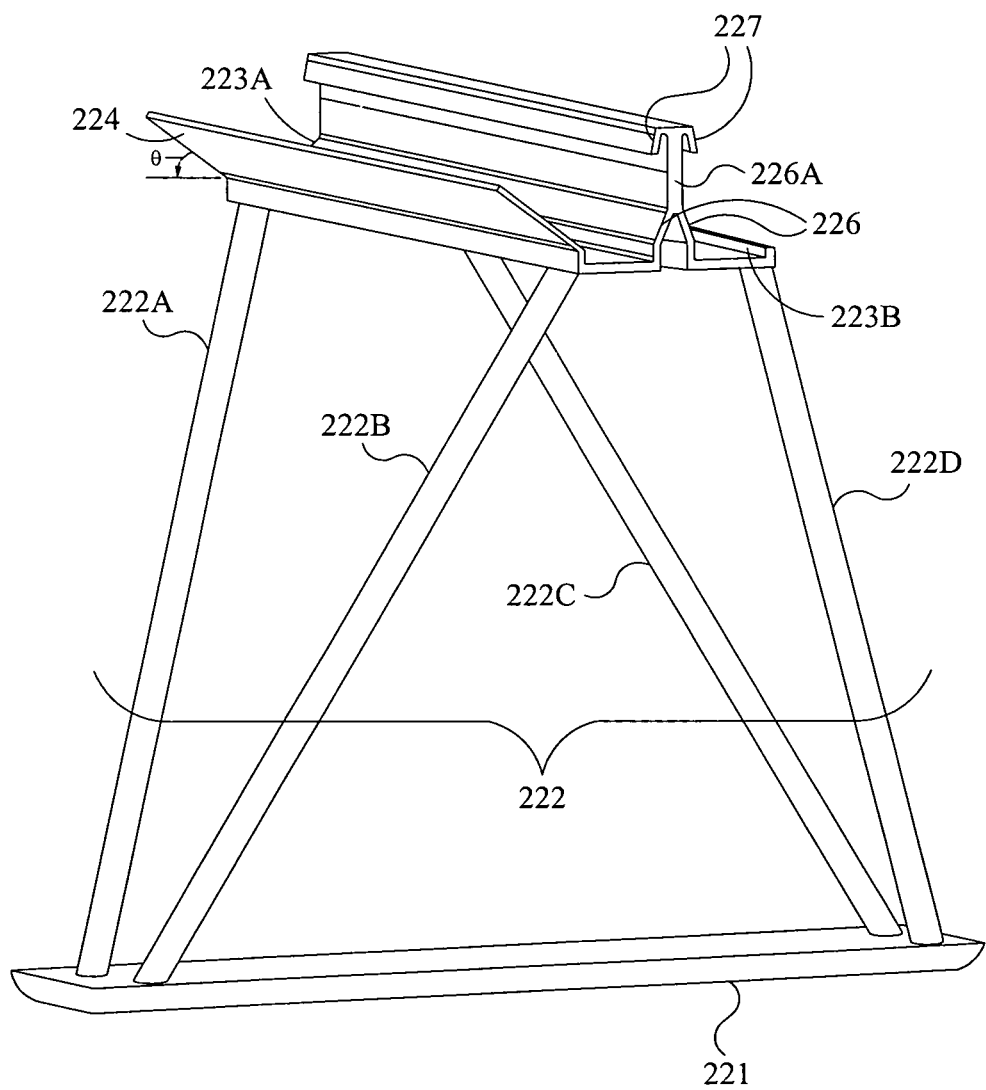
FIG. 2C shows an angled view of the support leg.

FIG. 2B shows an exemplary embodiment of the leg 220 in cross section. The leg 220 comprises a base 221. As shown, the base 221 has rounded edges. The base 221 is coupled to and supports a plurality of shafts 222. As shown, the shafts 222 are coupled to the base by spot welds. Alternatively, any convenient or known method of attaching the shafts 222 to the base 221 can be employed. The shafts 222 are in turn coupled to a support precipice 223. The support precipice 223 comprises two sides. The first side 223A is configured to accept a solar panel (not shown) in a modular fashion. A guiding wing 224 protrudes outwards at an angle Θ relative to a plane defined by the base 221 and/or the support precipice 223. The guiding wing 224 and angle Θ are configured to allow a solar panel (not shown) to be inserted at an angle and provide support therefor. The second side 223B comprises a beveled edge 225. As shown, the beveled edge 225 protrudes directly upwards from the second side 223B of the support precipice 223. Alternatively, the beveled edge 225 is able to be formed at an incident angle (not shown) relative to a plane defined by the base 221 and/or the support precipice 223. Furthermore, a second guiding wing (not shown) is able to be added. The beveled edge 225 is configured to allow the leg 220 to be coupled with an angled approach to an existing solar system or solar panel (not shown) to provide support therefor. The first side 223A and second side 223B of the support precipice 223 are divided by a t-bar 226. The t-bar 226 is bilaterally symmetrical in cross section. The t-bar 226 comprises an angled base 226A. The angled base 226A allows for ease when inserting a solar panel (not shown) into the first side 223A by providing an angled guide for insertion. The angled base 226A further allows for ease when coupling a leg 220 onto an existing support system 200 by providing an angled guide for proper coupling. The t-bar 226 further comprises two lips 227. The lips 227 are configured to accept a raised edge of a frame of a solar panel such as the frame 215 in FIG. 2A when the solar panel is inserted. Also, the lips are configured to accept a raised edge of a frame of an existing solar panel when the leg is angled and inserted into an existing support system 200. The t-bar 226 is able to be coupled to the support precipice 223 with spot welds, bolts, or any other known or convenient method. FIG. 2C shows an angled view of the leg 220. Preferably, the leg comprises four shafts 222A, 222B, 222C, 222D, each welded to the base 221 and support precipice 223. If the leg 220 is manufactured by commonly known extrusion methods, two triangular planar supports will be formed (not shown). The legs 220 are made from a metal, such as aluminum. However, any sufficiently rigid material to effectuate support of solar panels is able to be used.

Figure 1:
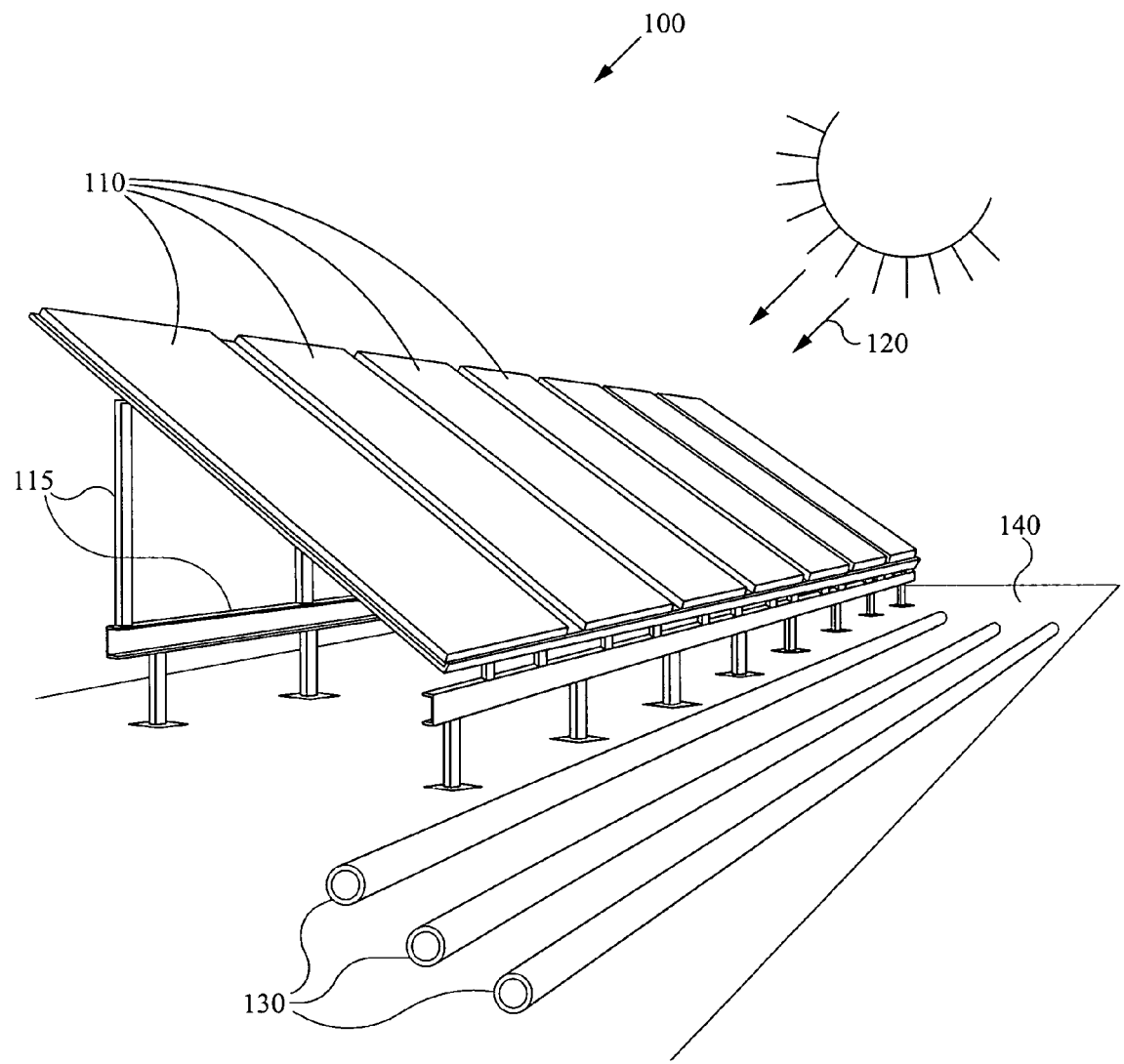
FIG. 1 shows a prior art solar power system.
Figure 3A:
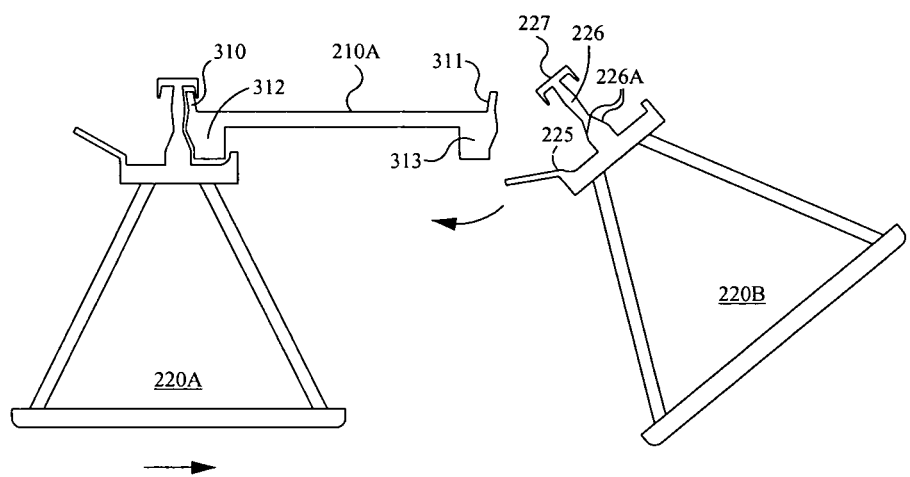
FIG. 3A shows modular assembly for a flat lying solar power system.
Figure 3A:
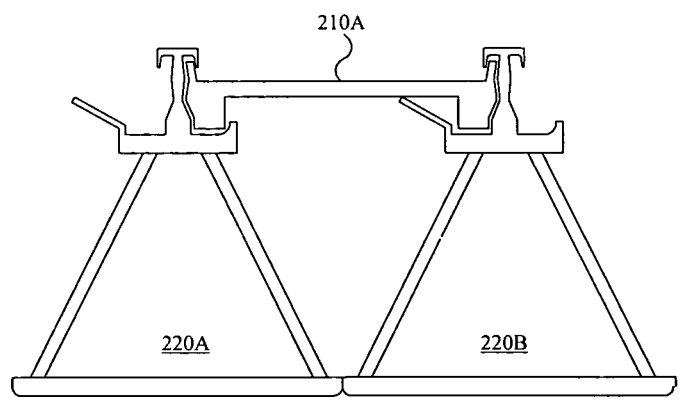

FIG. 3A shows the modular assembly of the system 200 of FIG. 1. A first leg 220A is provided. Using the guiding wing 224 as a guide, a first solar panel 210A is angled and inserted into the first side 223A of the support precipice 223. Preferably, the panel 210A has a first ridge 310 on its top surface configured to be received by the lip 227 of the t-bar 226. The angled base 226A of the t-bar 226 helps to guide the first ridge 310 into the lip 227 and securely couple. The panel 210A further comprises a second protruded ridge 312 along the bottom surface. The second protruded ridge is configured to be received by the first side 223A. The panel 210A further comprises a second ridge 311 on the top surface. As a second leg 220B is angled and coupled to the solar panel 210A, the second ridge 311 is received by the lip 227 of the t-bar 226 on the second leg 220B. Also, a second bottom ridge 313 is received by the second side 223A of the second leg 220B, effectuating more secure coupling. The two top ridges 310 and 311 and the two bottom ridges 312 and 313 are able to be connected by other ridges (not shown) around the perimeter or frame of the solar cell 210A.

Figure 3B:
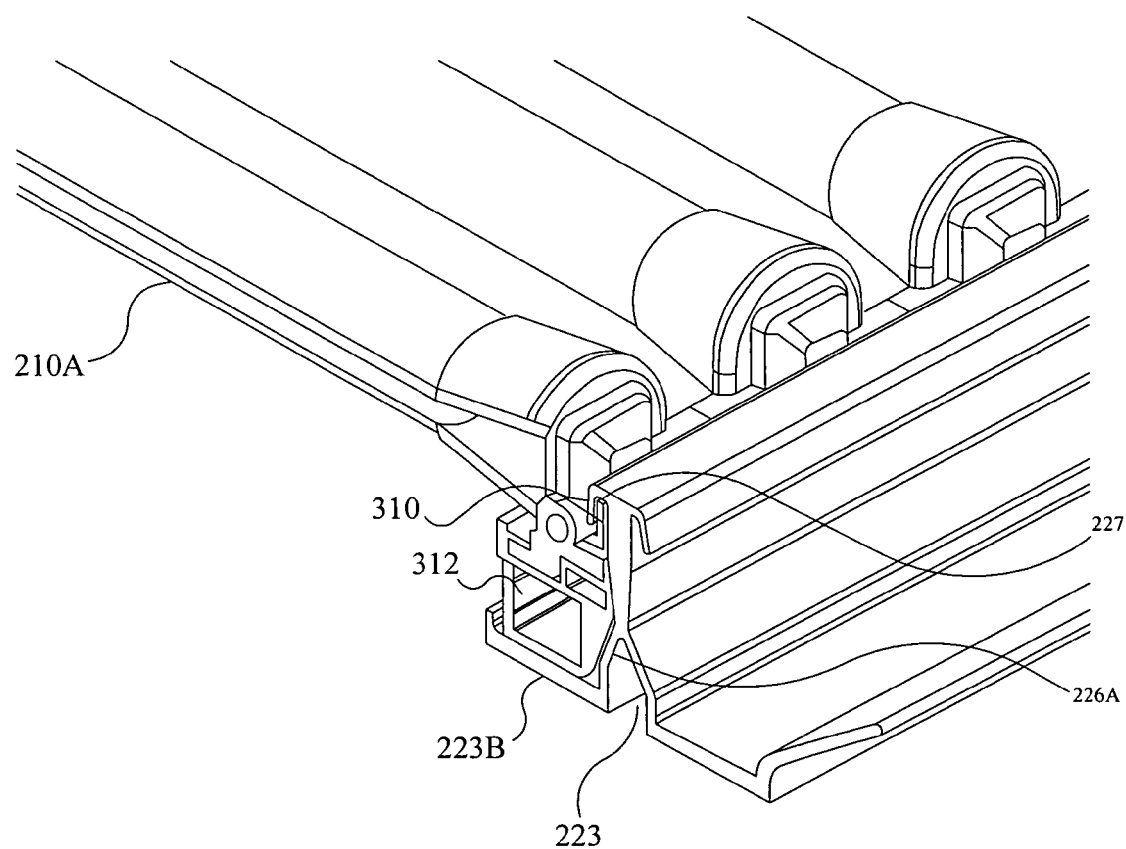
FIG. 3B shows a cross section of an assembled flat lying solar power system.

An exemplary coupling is shown in FIG. 3B. The top ridge 310 of the solar panel 210A is received by the lip 227 of the t-bar 226. The bottom protrusion 312 is received by the second side 223B of the support precipice 223. The coupling of the top ridge 310 with the lip 227 and bottom protrusion 312 with the second side 223B effectuate secure assembly that remains relatively simple to disassemble. Upon coupling of the second leg 220B, a second solar panel 210B is able to be mounted in a similar fashion, a third leg (not shown) and third solar panel (not shown), and so on, are able to be assembled. Alternatively, additional legs (not shown) are able to be assembled to the panel 210B before it is coupled to the second leg 220B.

Persons of ordinary skill in the relevant art will recognize many ways to effectuate modular assembly. It will also be apparent that since the system 200 is shown in cross section, more legs 220 will be coupled to the solar panels 210A and 210B to provide adequate support. As shown in FIG. 2A, each solar panel generally has 4 legs for support. Advantageously, the modular assembly of the system 200 does not require permanent coupling of the legs 220A or 220B to the surface on which they are being assembled. Furthermore, there is no need to permanently or semi-permanently couple the solar panels 210A and 210B to the legs 220A and 220B. As is apparent, the system 200 is able to be disassembled and reassembled with ease relative to existing solar panel systems 100 as shown in FIG. 1. The system 200 is able to be assembled by the end user rather than costly installation professionals. Also, the time required to assemble the system 200 will be substantially less than existing systems. More advantageously, the system 200 is able to be assembled over piping on the roof of a building. Because the system 200 is easily and quickly disassembled, routine maintenance or emergency repairs to piping (not shown) are able to be performed expediently without risking damage to the system 200. Also, the system 200 is able to be moved easily to avoid disassembly. As a result, a larger portion of a roof is able to be covered with solar panels using the system 200, greatly improving total current generation.

In one aspect, a leg for supporting a solar panel, comprises a base, a plurality of support shafts coupled to the base and a support precipice, comprising a first side and a second side, coupled to the support shafts. The leg further comprises a t-bar coupled to the support precipice for separating the first and second sides of the support precipice. The base, plurality of support shafts, support precipice and t-bar are coupled by any one of spot welds, bolts, and a combination thereof. In some embodiments, the base, plurality of support shafts, support precipice and t-bar are integrally formed as an extrudate. The first side of the support precipice further comprises a guiding wing for guiding solar panels during assembly. The guiding wing protrudes outward from the support precipice at an angle relative to a plane defined by one of the support precipice, base, and a combination thereof. The t-bar comprises an angled base for effectuating simple assembly. The t-bar is bilaterally symmetrical. The t-bar comprises lips to effectuate secure coupling of solar panels thereto.

In another aspect, a system for supporting solar cells comprises a plurality of legs, wherein the legs each have a first and a second receptacle, wherein the first and second receptacles are each configured to receive the perimeter of a solar panel.

The first receptacle comprises a guiding wing to effectuate modular assembly. The legs are configured such that the solar panel is substantially flat when supported by the legs.

In a further aspect, a leg for supporting a solar panel comprises a base, a plurality of support shafts coupled to the base, a support precipice comprising a first receptacle and a second receptacle and a t-bar coupled to the support receptacle for separating the first receptacle and the second receptacle. At least one of the first receptacle and the second receptacle comprise a guiding wing for effectuating modular assembly. The base, plurality of support shafts, support precipice and t-bar are coupled by any one of spot welds, bolts, and a combination thereof. In some embodiments, the base, plurality of support shafts, support precipice and t-bar are integrally formed as an extrudate. The first receptacle further comprises a guiding wing for guiding solar panels during assembly. The guiding wing protrudes outward from the support precipice at an angle relative to a plane defined by one of the support precipice, base, and a combination thereof. The t-bar comprises an angled base for effectuating simple assembly. The t-bar is bilaterally symmetrical. The t-bar comprises lips to effectuate secure coupling of solar panels thereto.

The present application has been described in terms of specific embodiments incorporating details to facilitate the understanding of the principles of deposition of materials on a non-planar surface. Many of the components shown and described in the various figures are able to be interchanged to achieve the results necessary, and this description should be read to encompass such interchange as well. As such, references herein to specific embodiments and details thereof are not intended to limit the scope of the claims appended hereto.

We claim:

1. A leg for supporting a solar panel over a surface, comprising
    a. a base positioned on the surface;
    b. a plurality of support shafts coupled to the base;
    c. a support platform, comprising a first side and a second side, coupled to the support shafts, wherein the first side comprises a guiding wing, wherein the guiding wing protrudes outward from the support platform at an acute angle of greater than zero relative to the surface; and
    d. a t-bar coupled to the support platform through the bottom of the t-bar, thereby separating the first and second sides of the support platform, wherein
        the t-bar comprises: (i) an angled base at the bottom of the t-bar, the bottom of the angled base being wider than the top of the angled base, (ii) a first lip at an upper portion of the t-bar facing the first side of the support platform, and (iii) a second lip at the upper portion of the t-bar facing the second side of the support platform, and
        the angled base, the first lip and the guiding wing cooperate to form a channel for receiving and structurally supporting a solar panel parallel to the surface.

2. The leg of claim 1 wherein the base, plurality of support shafts, support platform and t-bar are coupled by any one of spot welds, bolts, and a combination thereof.

3. The leg of claim 1 wherein the base, plurality of support shafts, support platform and t-bar form a single body.

4. The leg of claim 1 wherein the t-bar is bilaterally symmetrical.

* * * * *